(12) United States Patent
Shin et al.

(10) Patent No.: US 8,867,275 B2
(45) Date of Patent: Oct. 21, 2014

(54) FLASH MEMORY DEVICE AND PROGRAM METHOD

(71) Applicant: Samsung Electronics Co., Ltd., Suwon-Si (KR)

(72) Inventors: Seung-Hwan Shin, Ulsan (KR); Kitae Park, Seongnam-Si (KR); Hyun-Wook Park, Hwaseong-Si (KR); Jun-Hee Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 96 days.

(21) Appl. No.: 13/625,114

(22) Filed: Sep. 24, 2012

(65) Prior Publication Data

US 2013/0128671 A1  May 23, 2013

(30) Foreign Application Priority Data

Nov. 21, 2011 (KR) ........................ 10-2011-0121332

(51) Int. Cl.
*G11C 16/06* (2006.01)
*G11C 11/56* (2006.01)
*G11C 16/10* (2006.01)

(52) U.S. Cl.
CPC ................ *G11C 16/10* (2013.01); *G11C 16/06* (2013.01); *G11C 11/5621* (2013.01)
USPC ............ 365/185.18; 365/185.03; 365/189.05; 365/185.17; 365/230.08

(58) Field of Classification Search
CPC .... G11C 16/10; G11C 11/5621; G11C 16/06; G11C 16/26; G11C 16/349; G11C 7/1006; G11C 8/00; G06F 21/85; G06F 2212/7203
USPC ............ 365/185.03, 189.05, 185.17, 185.29, 365/230.08
See application file for complete search history.

(56) References Cited

U.S. PATENT DOCUMENTS

| 7,864,587 B2 | 1/2011 | Roohparvar |
| 8,077,519 B2 | 12/2011 | Roohparvar |
| 2008/0172520 A1 | 7/2008 | Lee |
| 2008/0239811 A1* | 10/2008 | Tanaka ..................... 365/185.11 |
| 2010/0220526 A1 | 9/2010 | Choi et al. |

FOREIGN PATENT DOCUMENTS

| KR | 1020090129625 A | 12/2009 |
| KR | 102010098968 A | 9/2010 |
| KR | 1020110001098 A | 1/2011 |
| WO | 2010033975 A2 | 3/2010 |

* cited by examiner

*Primary Examiner* — Thong Q Le
(74) *Attorney, Agent, or Firm* — Volentine & Whitt, PLLC

(57) ABSTRACT

Disclosed is a flash memory device and programming method that includes; receiving buffer data and determining between a high-speed mode and a reliability mode for buffer data, and upon determining the reliability mode storing the buffer data in a first buffer region, and upon determining the high-speed mode storing the buffer data in a second buffer region. The memory cell array of the flash memory including a main region and a separately designated buffer region divided into the first buffer region and second buffer region.

15 Claims, 10 Drawing Sheets

(PRIOR ART)

FLASH MEMORY DEVICE AND PROGRAM METHOD

CROSS-REFERENCE TO RELATED APPLICATIONS

A claim of priority under 35 U.S.C §119 is made to Korean Patent Application No. 10-2011-0121332 filed Nov. 21, 2011, the subject matter of which is hereby incorporated by reference.

BACKGROUND

The inventive concept relates generally to flash memory devices and programming methods for flash memory devices. More particularly, the inventive concept relates to flash memory devices and methods providing improved programming speed.

Semiconductor memory devices may be classified as volatile or nonvolatile according to their operating characteristics. Volatile memory devices perform read/write operations at high speed but stored data is lost in the absence of applied power. In contrast, nonvolatile memory devices are able to retain stored data in the absence of applied power. So-called "flash memory" is one type of nonvolatile memory that provides exceptional memory cell integration density. As such, flash memory has been widely adopted for use as bulk data storage media and within contemporary memory systems.

Where flash memory cells were once limited to binary data, emerging flash memory cells are capable of storing multiple data bits (i.e., 2 or more), However, the programming of multiple data bits in flash memory requires careful control over the threshold voltage distributions that respectively correspond to programmed data values. For example, coupling between proximate memory cells may cause shifting or expansion of threshold voltage distributions. Such shifting and/or expansion of threshold voltage distribution(s) erodes read margins, thereby leading to read data errors.

SUMMARY

Embodiments of the inventive concept provide a flash memory device array comprising; a memory cell array including a main region and a buffer region separately designated from the main region and configured to temporarily store buffer data to be programmed to the main region, wherein the buffer region is divided into a first buffer region and a second buffer region, a page buffer configured to program buffer data to the buffer region, and control logic configured to control operation of the page buffer during the programming of the buffer data to the buffer region, wherein upon a determination by the control logic of a reliability mode the buffer data is stored in the first buffer region and upon a determination of a high-speed mode the buffer data is stored in the second buffer region.

Embodiments of the inventive concept provide a memory system comprising; a memory controller including a Synchronous Read Only Memory (SRAM) providing 1-bit buffer data, and a flash memory device array receiving the 1-bit buffer data. The flash memory device comprises; a memory cell array including a main region and a buffer region separately designated from the main region and configured to temporarily store buffer data to be programmed to the main region, wherein the buffer region is divided into a first buffer region and a second buffer region, a page buffer configured to program buffer data to the buffer region, and control logic configured to control operation of the page buffer during the programming of the buffer data to the buffer region, wherein upon a determination by the control logic of a reliability mode the buffer data is stored in the first buffer region and upon a determination of a high-speed mode the buffer data is stored in the second buffer region.

Embodiments of the inventive concept provide a method of programming a memory cell array including a main region and a separately designated buffer region divided into a first buffer region and a second buffer region, the method comprising; receiving buffer data and determining between a high-speed mode and a reliability mode for buffer data, and upon determining the reliability mode storing the buffer data in the first buffer region, and upon determining the high-speed mode storing the buffer data in the second buffer region.

BRIEF DESCRIPTION OF THE DRAWINGS

The above and other objects and features will become apparent from the following description made with reference to the accompanying drawings.

DETAILED DESCRIPTION

The inventive concept will now be more fully described with reference to certain embodiments illustrated in the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Increased integration density for contemporary flash memory necessarily requires decreasing minimum feature size(s) for the elements making up the flash memory. At the same time, however, the coupling effects between floating gates of the constituent memory cells may increase under certain bias conditions. The combination of these two factors, among others, leads to increased coupling effects between proximate memory cells. As a result, the reliability of contemporary flash memory devices and particularly in Multi-Level Cell (MLC) flash memory, as compared with Single-Level Cell (SLC) memory cells, is reduced.

Recognizing the difficulties associated memory threshold voltage distribution shifting and expansion in MLC flash memory, certain reprogram methods have been proposed. Reprogram methods essentially refine threshold voltage distributions following an initial programming operation—generally by making the threshold voltage distributions more narrow, better defined within ascribed ranges, and therefore more readily distinct one from the other during a subsequent read operation. Reprogram methods are often iterative in their approach to threshold voltage distribution refinement, but the number and/or application of multiple iterations may vary according to data state, memory system operating conditions, and/or error tolerance. Hereafter, a typical reprogram method will now be described in some additional detail with reference to FIGS. 1A, 1B and 1C.

Figure 1A:
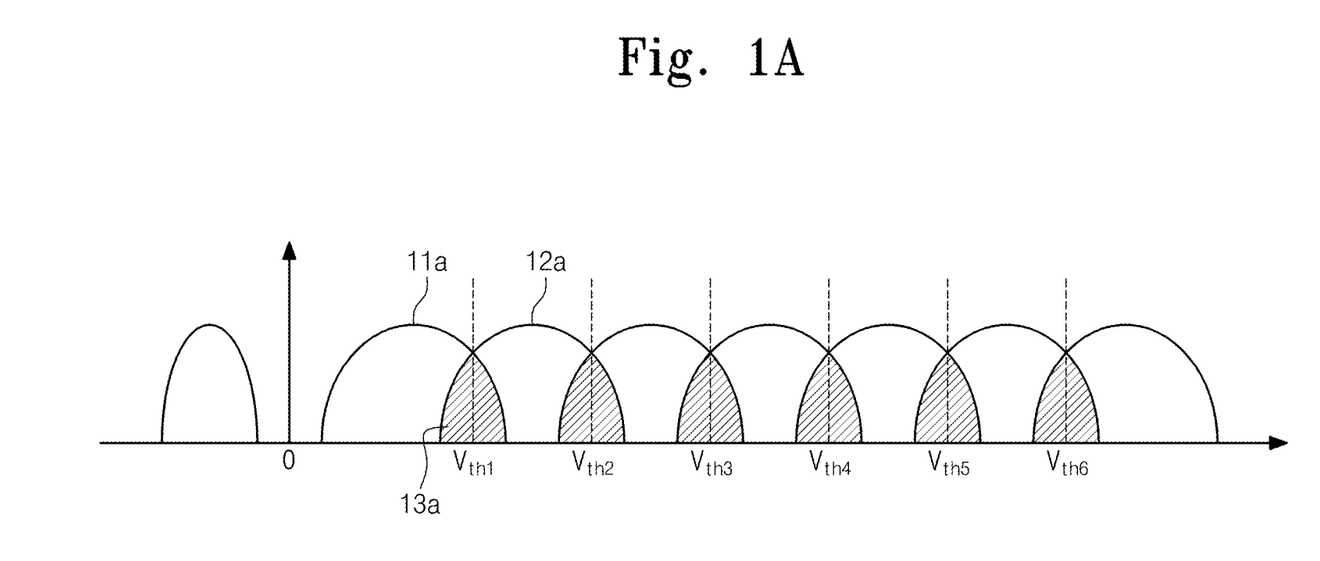
FIGS. 1A through 1C are exemplary threshold voltage distribution diagrams describing a reprogram method for a flash memory.
Figure 1B:
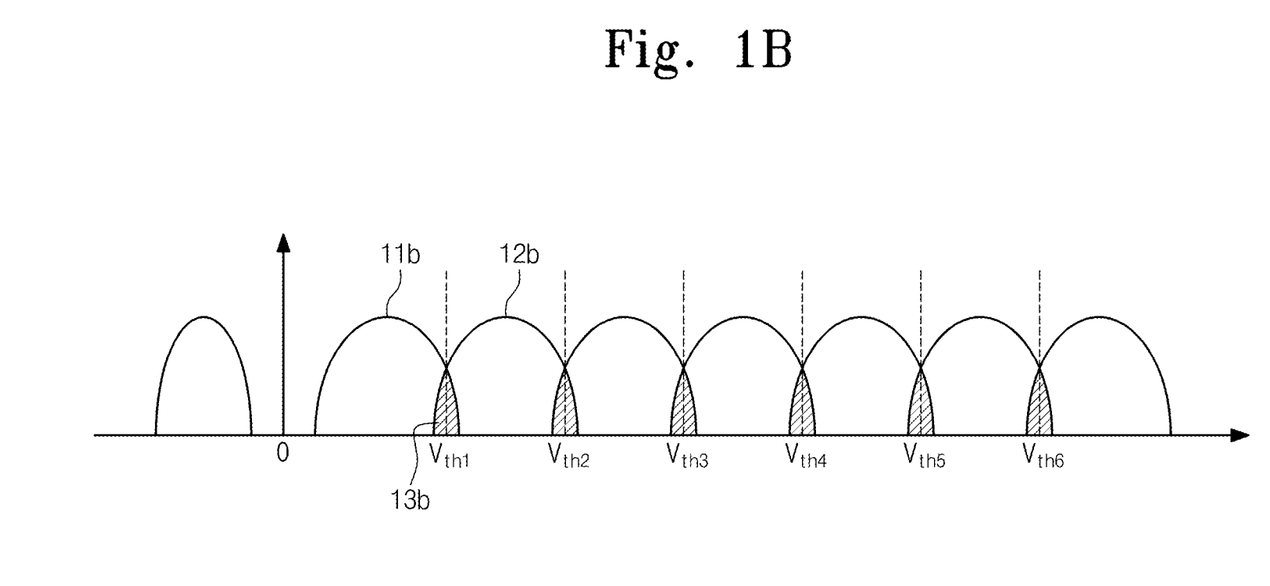
Figure 1C:
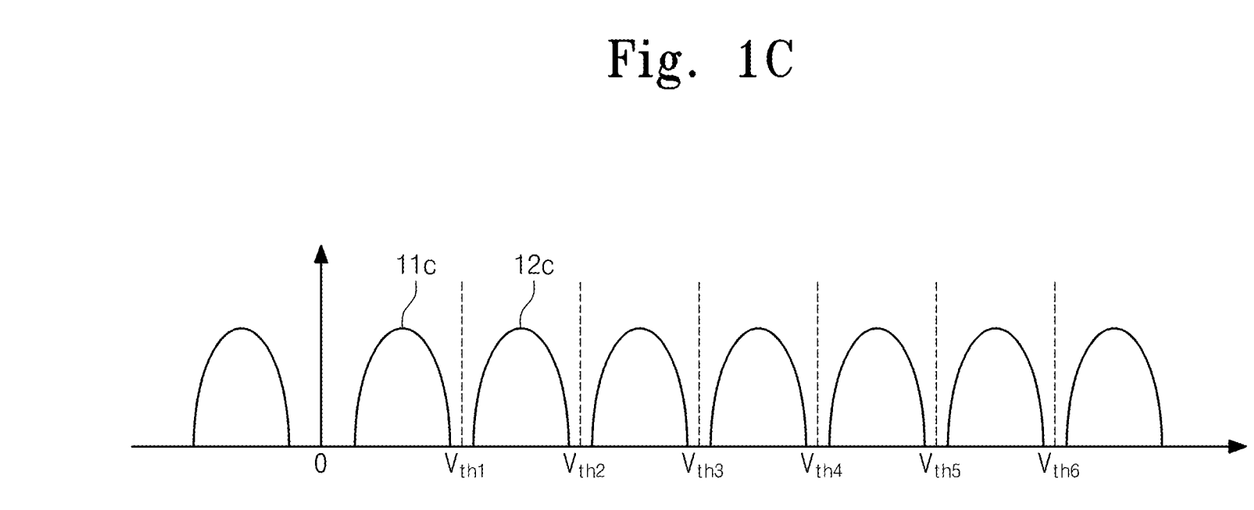

FIGS. 1A, 1B and 1C are related diagrams describing a reprogram method for 3-bit MLC flash memory that includes, but way of example, three (3) sequentially performed program (or reprogram) operations.

FIG. 1A illustrates threshold voltage distributions for memory cells following execution of a first program operation. Although the first program operation has been performed, it may be difficult to clearly distinguish threshold voltage distributions among various "target states" respectively corresponding to data states. For example, a first target state 11a and a second target state 12a may partially overlap to form an ambiguous data value region 13a. A memory cell supposedly programmed to the first target state 11a yet having a threshold voltage higher than the reference threshold voltage Vth1, may well be erroneously interrupted as being programmed to the second target state 12a, thereby causing a data error. Likewise, a memory cell supposedly programmed to the second target state 12a yet having a threshold voltage lower than the reference threshold voltage Vth1 may be erroneously interrupted as being programmed to the first target state 11a, thereby causing a data error.

FIG. 1B illustrates threshold voltage distributions for memory cells following execution of the first program operation and a succeeding second program (or first reprogram) operation. As may be seen from FIG. 1B, the second program operation better defines the respective threshold voltage distributions among the various target states. Thus, the size of a resulting ambiguous data value region 13b is reduced, as compared with threshold voltage distributions of FIG. 1A. Nevertheless, it is possible to erroneously read a programmed a memory cell having a threshold voltage in the ambiguous data value region 13b.

FIG. 1C illustrates threshold voltage distributions for memory cells following execution of a third, successive program operation. Once the third program operation has been executed, the respective threshold voltage distributions among the target states are all clearly distinguishable. For example, the first target state 11c and the second target state 12c no longer overlap, and programmed data may be correctly read in relation to the "adjacent" threshold voltage distributions.

Figure 2:
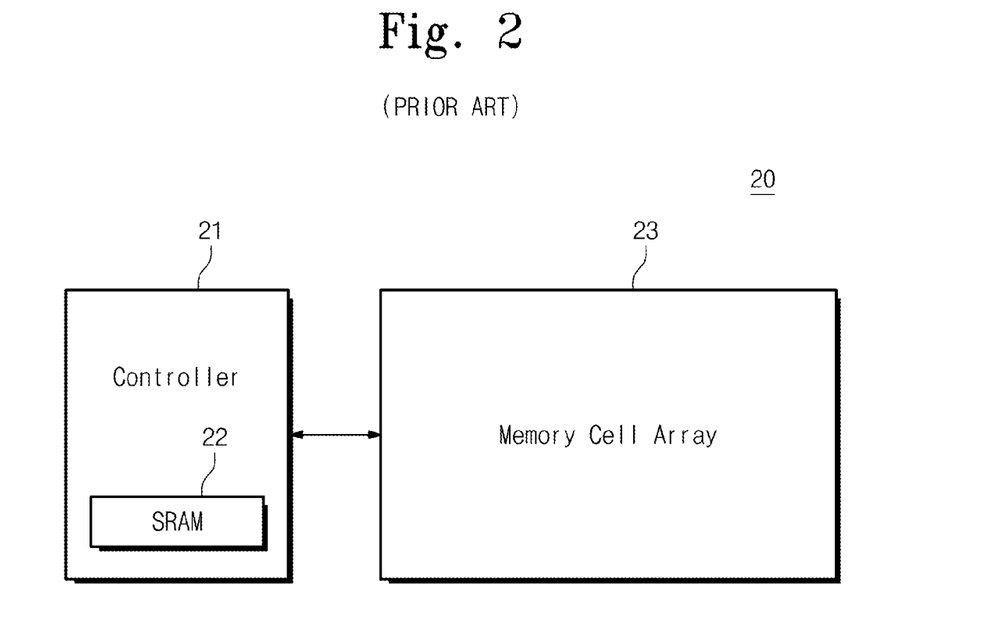
FIG. 2 is a general block diagram illustrating a conventional memory system.

FIG. 2 is a block diagram generally illustrating a conventional memory system. Referring to FIG. 2, a memory system 20 includes a memory controller 21 controlling access to data programmed to and read from a flash memory cell array 23 including flash MLCs.

The memory controller 21 includes a Synchronous Read Only Memory (SRAM) 22. The SRAM 22 may be used to store "buffer data" to be programmed to the flash memory 23 using a competent reprogram method. In particular, during reprogramming, the memory cells of the flash memory 23 may be simultaneously and respectively programmed to any one of a plurality of target states. Assuming the use of 3-bit MLCs, each memory cell will necessitate 3-bit buffer data for setting a page buffer. Hence, the SRAM 22 will need to store 3-bit buffer data in order to provide it to the page buffer. And since 3-bit buffer data must be stored in the SRAM 22, the SRAM 22 will be quite large. This requirement increases the overall cost of the memory system 20.

In view of the undesirable costs and large size of the SRAM 22, a so-called On-chip Buffered Programming (OBP) approach has been proposed in which the storage space provided by the flash memory 23 is partially used as a buffer memory.

Figure 3:
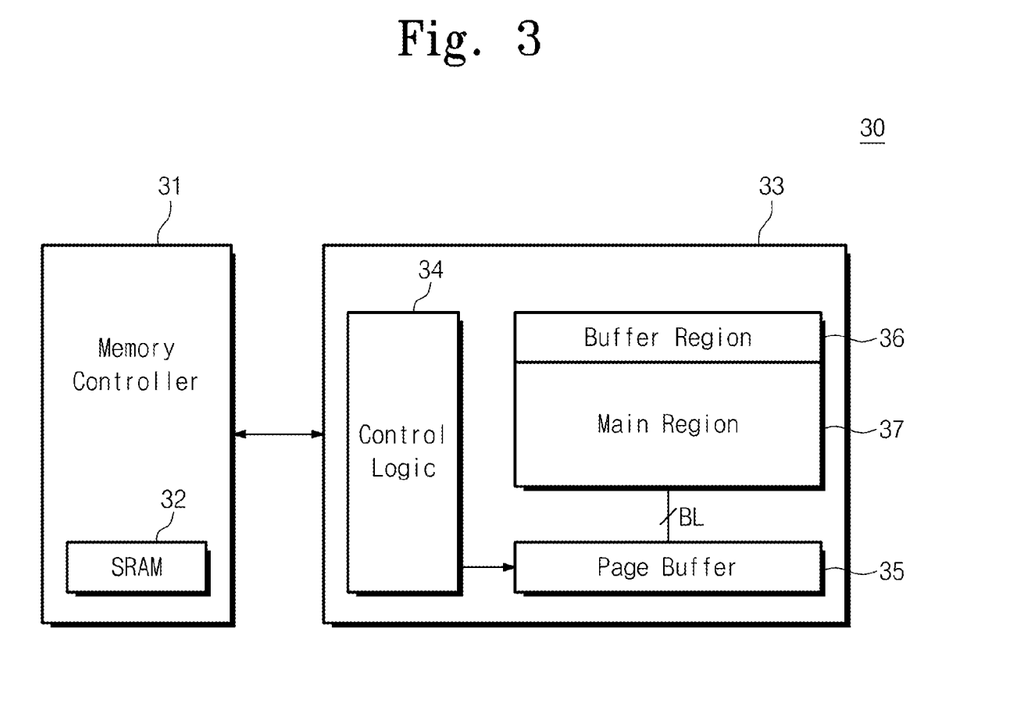
FIG. 3 is an On-chip Buffered Programming memory system having a buffer area included in a memory.

FIG. 3 generally illustrates a memory system 30 capable of performing On-chip Buffered Programming (OBP). The memory system 30 includes a memory controller 31 controlling access to data in a flash memory 33. Here again, the memory controller 31 includes an SRAM 32. The flash memory 33 is illustrated as further including control logic 34, a page buffer 35, a buffer region 36, and a main region 37.

The SRAM 32 may be used to provide the flash memory 33 with 1-bit buffer data. The 1-bit buffer data provided to the flash memory 33 may be stored in the buffer region 36 via the page buffer 35.

The buffer region 36 may be a region in which buffer data (i.e., data to be stored in the main region 37) is temporarily stored. In a case wherein the main region 37 is programmed with 3-bit data, the page buffer 35 may be set up with 3-bit data, and the buffer region 36 may be used to store 1-bit buffer data provided from the SRAM 32. The page buffer 35 may read buffer data stored in the buffer region 36 using a 3-bit unit, and then program the data to the main region 37.

The control logic 34 may be used to control a sequence of program steps associated with operation of the page buffer 35. However, the design and operation of both the control logic 34 and page buffer 35 are deemed to be understood by those skilled in the art.

With this configuration, 1-bit data may first be provided from the SRAM 22 to the buffer region 36 via the page buffer 35. Thereafter, three (3) sets of the 1-bit data may be "gathered" by the page buffer 35 from the buffer region 36 before being programmed to main region 37. That is, the SRAM 22 may store 1-bit data to be written to the main region 37 in the buffer region 36, so that the required storage space (and the commensurate cost) required by the SRAM 22 may be reduced.

Unfortunately, the programming speed associated with memory systems like memory system 30 using a conventional On-chip Buffered Programming approach is relatively slow, since multiple write/read operations between the SRAM 32 and buffer region 36 must be performed before each multi-bit program operation to the main region 37.

Figure 4:
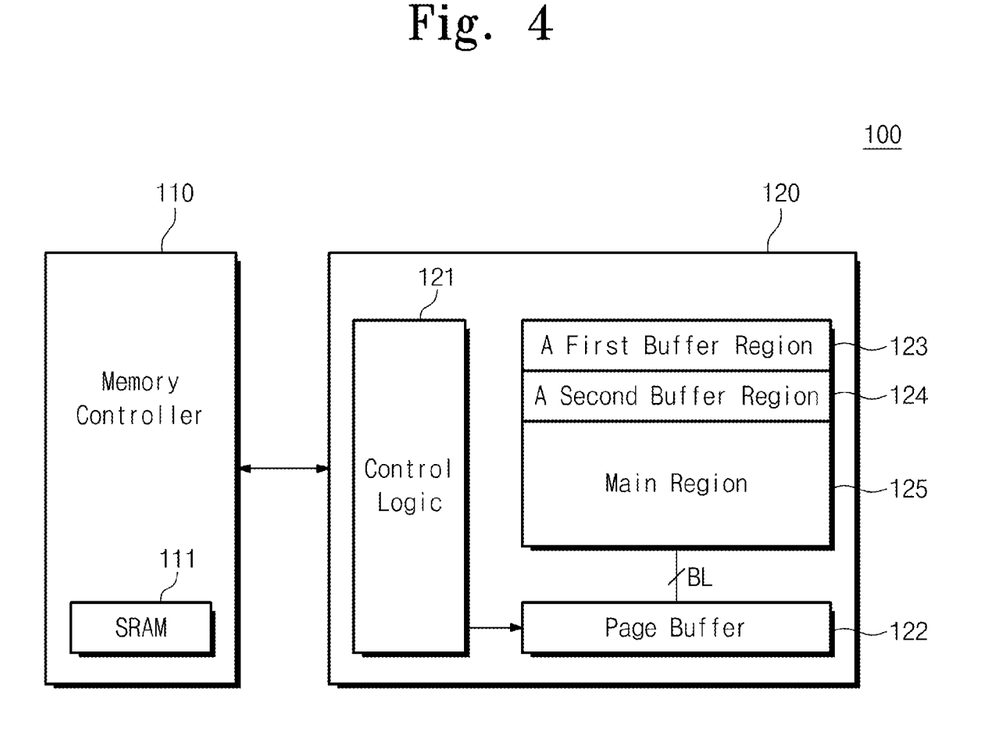
FIG. 4 is a block diagram illustrating a memory system according to an embodiment of the inventive concept.

FIG. 4 is a block diagram schematically illustrating a memory system according to an embodiment of the inventive concept. Referring to FIG. 4, a memory system 100 generally includes a memory controller 110 and a flash memory 120. The memory controller 110 includes an SRAM 111. The flash memory 120 includes control logic 121, a page buffer 122, a first buffer region 123, a second buffer region 124, and a main region 125.

The memory controller 110 controls access to data (programmed to and/or read from) the flash memory 120. The SRAM 111 is assumed to provide 1-bit "buffer data" to the flash memory 120. The 1-bit buffer data may be stored in either one or both of the first buffer region 123 and the second buffer region 124 via the page buffer 122.

The first buffer region 123 and the second buffer region 124 temporarily store the buffer data to be programmed in the main region 125. Assuming that the memory cells of the main region 125 are programmed with 3-bit data (i.e., are 3-bit MLCs), the page buffer 122 may be set up with 3-bit data recognizing that the first and second buffer region 123 and 124 store 1-bit buffer data, as provided from the SRAM 111. Thus, the page buffer 122 will read buffer data stored in the first and second buffer region 123 and 124 in order to "gather" program data into a 3-bit unit. Then, the 3-bit data will be programmed to the main region 125.

Hence, a reprogram operation may be executed according to a first operation programming 1-bit buffer data from the SRAM 32 to one of the first and second buffer regions 123 and 124, a second operation reading buffer data stored in one or both of the first and second buffer region 123 and 124, and a third operation setting up the page buffer 122 with the M-bit data (where "M" is an integer greater than 1) as read from the first and second buffer regions 123 and 124 data, and a fourth operation programming the M-bit data from the page buffer 122 to the main region 125. Within this sequence of operations executing the reprogram operation, as much as 20% of the total time required to perform conventional reprogramming operations may be consumed by the first operation. Certain embodiments of the inventive concept markedly improve the efficiency of the first operation, and thereby improve overall reprogramming performance.

Thus, within the context of certain embodiments of the inventive concept, buffer data being stored in the flash memory 120 may be selectively stored in one of the first and second buffer regions 123 and 124 according to separate write modes. For example, buffer data may be stored in the first buffer region 123 during a reliability mode and in the second buffer mode 124 during a high-speed mode.

Herein, the reliability mode (i.e., a slower write mode) has a lower probability of generating data errors than the high-speed mode. In contrast, the high-speed mode enables buffer data to be more quickly written to the flash memory 120. Hence, embodiments of the inventive concept allow a well-considered trade-off between program speed and reliability of data during the first operation storing buffer data in the buffer memory of a flash memory device. Thus, data requiring a relatively low level of reliability (e.g., temporary file data— hereinafter, "low-reliability data") may be programmed using the high-speed mode, while more critical data (e.g., metadata or log data) demanding a higher level of reliability (hereinafter, "high-reliability data") may be programmed using the reliability mode.

The decision to use either the high-speed mode or the reliability mode may be made by the memory controller 110. That is, the control logic 121 may control operation of the page buffer 122 based on a determined write mode. In the high-speed mode, the page buffer 122 may program buffer data provided from the SRAM 111 in the second buffer region 124 at a higher speed, as compared with the reliability mode.

A program speed may be accelerated by increasing a program voltage and a voltage increment of ISPP (Incremental Step Pulse Programming). Acceleration of the program speed tends to broaden the threshold voltage distributions for memory cells, and the reliability of data is reduced.

The page buffer 122 may read buffer data from the second buffer region 124 to program it to the multi-level cells of the main region 125. For example in certain embodiments, 3-bit data may be programmed with the page buffer 122 being set up with 3-bit data. The page buffer 122 may read 3-bit data gathered at the second buffer region 124 to program the main region 125 with the resulting data.

The above-described operations of the page buffer 122 may be performed under the control of the control logic 121. The control logic 121 and the page buffer 122 are well known, and description thereof is thus omitted.

During the reliability mode, the page buffer 122 may program buffer data provided from the SRAM 111 in the first buffer region 123 at a slower data rate as compared with the high-speed mode.

The inherent program speed may be reduced by decreasing the threshold program voltage and/or the voltage increment of the ISPP. Reducing the program speed tends to make threshold voltage distributions of memory cells more narrow, thereby improving the reliability of data.

The page buffer 122 may read buffer data from the first buffer region 123 to program it to the MLCS of the main region 125. For example in certain embodiments, 3-bit data may be programmed as the page buffer 122 is be set up with 3-bit data. The page buffer 122 may read 3-bit data gathered at the first buffer region 123 to program the main region 125.

The above-described operations of the page buffer 122 may be performed under the control of the control logic 121. The control logic 121 and the page buffer 122 are well known, and description thereof is thus omitted.

The term "increase or decrease in a program speed" may be used to express a relative speed. That is, the reliability mode may mean that a buffer region is programmed in a speed slower than that of the high-speed mode. On the other hand, the high-speed mode may mean that a buffer region is programmed in a speed faster than that of the reliability mode.

With the above description, the overall program performance may be improved by programming of data in a rapid speed according to a data type.

Figure 5:
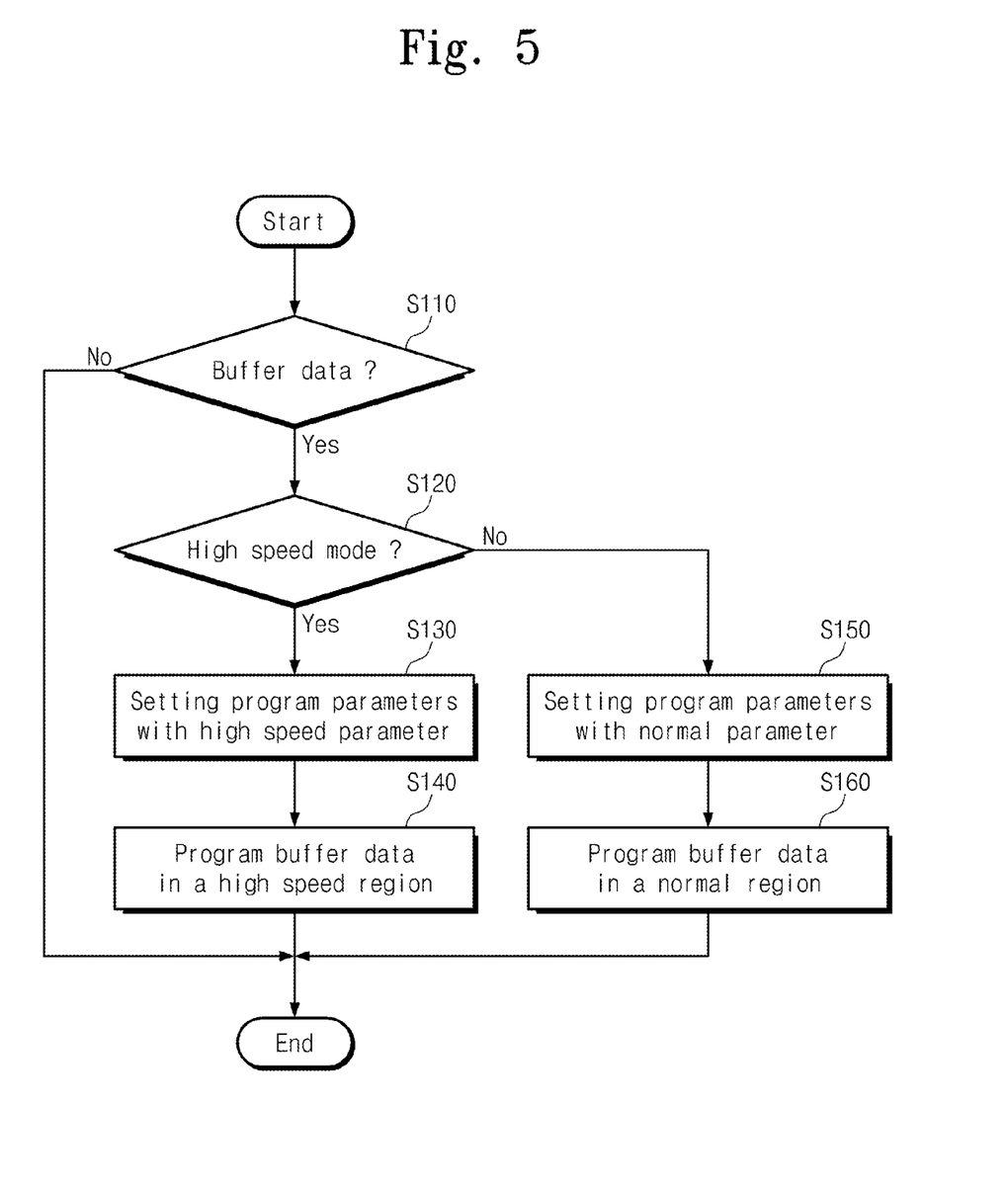
FIG. 5 is a flowchart summarizing a program method according to an embodiment of the inventive concept.

FIG. 5 is a flowchart summarizing a program method according to an embodiment of the inventive concept. Referring to FIG. 5, a program method may include operations S110 through S160.

In operation S110, a memory controller 110 (refer to FIG. 4) may decide a data type. If the incoming data is buffer data (S110=YES), the method proceeds to operation S120. In the event that data is not buffer data (S110=NO), it will not be stored in either of the first and second buffer regions and the method is ended.

In operation S120, the memory controller 110 determines what write (or program) mode is being used for the buffer data. The write mode may be decided according to the nature (e.g., the importance or criticality) of the buffer data. For example, if the buffer data is metadata (and therefore being high-reliability data), the program mode for the buffer data may be determined to be the reliability mode (S120=NO). On the other hand, if the buffer data is temporary data (and therefore being low-reliability data), the write mode for the buffer data may be determined to be the high-speed mode (S120=YES).

If the write mode for the buffer data is determined to be the high-speed mode, the method proceeds to operation S130. If not, the method proceeds to operation S150.

In operation S130, control logic 121 may control a page buffer 122 so as to set program parameter(s) for the buffer data with at least one high-speed parameter. Herein, the program parameter may include a program voltage, an ISPP pulse, and the like. The control logic 121 and the page buffer 122 are well known, and description thereof is thus omitted.

In operation S140, the page buffer 122 may program the buffer data in the second buffer region 124 according to the set program parameter(s). In the working embodiment, the second buffer region 124 of a buffer region is designated to store buffer data determined to be suitably programmed using the high-speed mode.

In operation S150, control logic 121 may control the page buffer 122 so as to set program parameter(s) for the buffer data with at least one normal (i.e., not high-speed) parameter. As before, the program parameter may include a program voltage, an ISPP pulse, and the like.

In operation S160, the page buffer 122 may program the buffer data in the first buffer region according to the set program parameter(s). In the working embodiment, the first buffer region 123 of a buffer region is designated to store buffer data determined to be suitably programmed using a normal (or reliability) mode.

With the above-described program method, an overall program speed may be improved by deciding a program speed of buffer data differently according to a program mode of buffer data.

Figure 6:
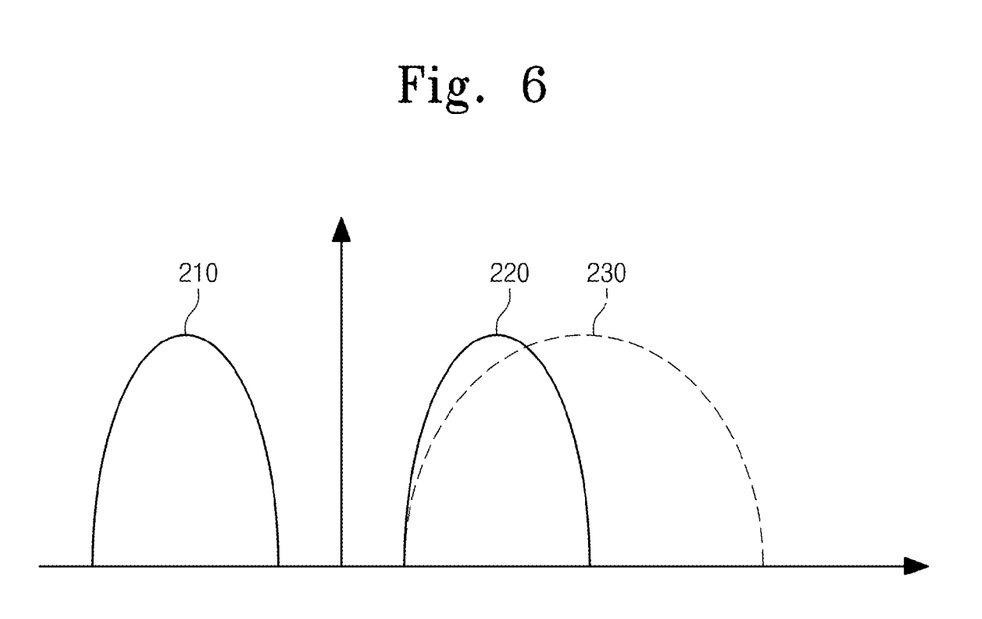
FIG. 6 is a diagram of a threshold voltage distribution for a buffer memory according to an embodiment of the inventive concept.

FIG. 6 is a diagram indicating a threshold voltage distribution of a buffer memory according to an embodiment of the inventive concept. In FIG. 6, there are illustrated an erase threshold voltage distribution 210, a threshold voltage distribution 220 of a normal buffer memory 123 (hereinafter, referred to as a normal threshold voltage distribution), and a threshold voltage distribution 230 of a high-speed buffer memory 124 (hereinafter, referred to as a high-speed threshold voltage distribution).

The erase threshold voltage distribution 210 may indicate a threshold voltage distribution corresponding to an erase state. The normal threshold voltage distribution 220 may indicate a threshold voltage distribution formed when buffer data is programmed in a reliability mode. The high-speed threshold voltage distribution 230 may indicate a threshold voltage distribution formed when buffer data is programmed in a high-speed mode.

At the high-speed mode, buffer data may be programmed by a program voltage and an ISPP pulse that are increased as compared with the reliability mode. Thus, the high-speed threshold voltage distribution 230 may be wider than the normal threshold voltage distribution 220. In example embodiments, although not illustrated in figures, a threshold voltage distribution may be formed in a similar shape in case of erasing. Thus, in case that buffer data is programmed in the high-speed mode, the reliability of the buffer data may be lowered, while the program speed may increase.

Since a threshold voltage distribution of buffer data is varied according to a program mode as illustrated in FIG. 6, a program verification voltage, a read voltage, or a pass voltage associated with the buffer data may be decided differently. At the high-speed mode, buffer data may be programmed or read using a low program verification voltage, a low read voltage, or a low pass voltage.

With the above description, a memory system 100 operate according to two program modes in which buffer data is programmed into separately defined buffer regions. During a high-speed mode, buffer data is programmed at a relatively higher program speed.

Figure 7:
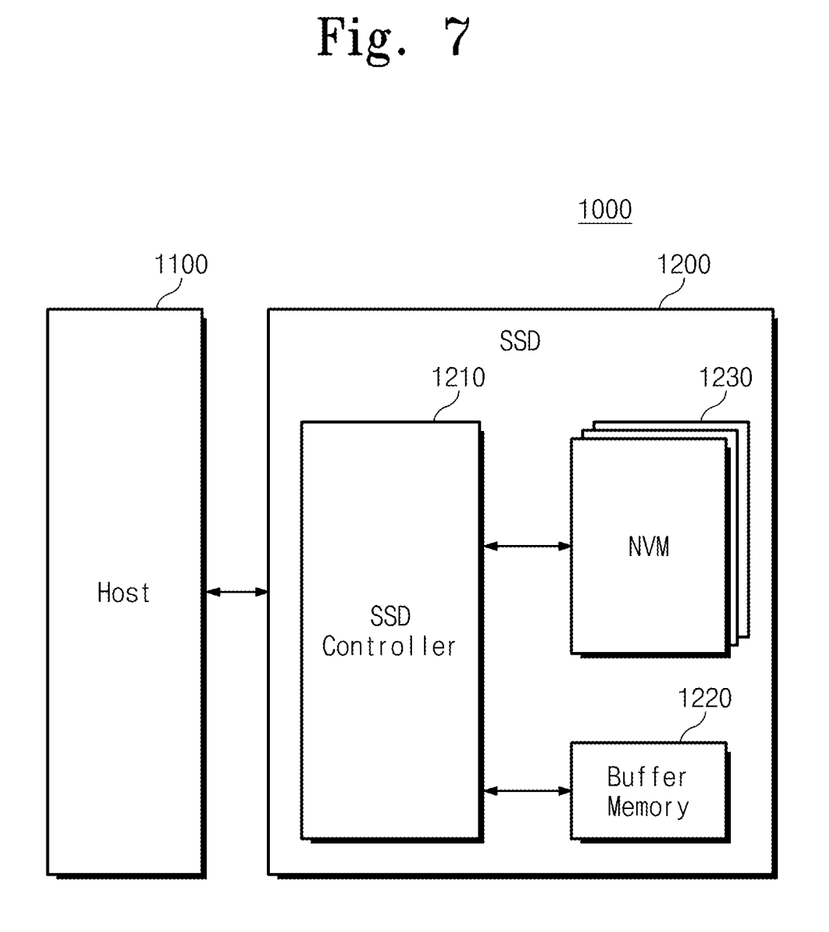
FIG. 7 is a block diagram illustrating a user device including a solid state disk according to an embodiment of the inventive concept.

FIG. 7 is a block diagram illustrating a user device including a solid state disk according to an embodiment of the inventive concept. Referring to FIG. 7, a user device 1000 may include a host 1100 and an SSD 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100. The SSD controller 1210 may access the nonvolatile memory device 1230 according to the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The nonvolatile memory device 1230 may include a buffer region (not shown). The nonvolatile memory device 1230 may program the buffer region in a plurality of program modes according to a type of buffer data to be stored in the buffer region. In example embodiments, the program modes may include a high-speed program mode and a reliability program mode. At the high-speed mode, the nonvolatile memory device 1230 may program buffer data in a rapider speed as compared with the reliability mode. In example embodiments, the nonvolatile memory device 1230 may store buffer data in different regions that are divided according to program modes.

With this manner, a program speed on buffer data may increase, so that the program performance is improved.

The buffer memory 1220 may temporarily store write data provided from the host 1100 or data read out from the nonvolatile memory device 1230. In the event that data existing in the nonvolatile memory device 1230 is cached at a read request of the host 1100, the buffer memory 1220 may support a cache function of providing cached data directly to the host 1100. Typically, a data transfer speed of a bus format (e.g., SATA or SAS) of the host 1100 may be higher than that of a memory channel of the SSD 1200. That is, in the event that an interface speed of the host 1100 is remarkably fast, lowering of the performance due to a speed difference may be minimized by providing the buffer memory 1220 having a large storage capacity.

The buffer memory 1220 may be formed of a synchronous DRAM to provide sufficient buffering to the SSD 1200 used as an auxiliary mass storage device. However, the buffer memory 1220 is not limited to this disclosure.

The nonvolatile memory device 1230 may be provided as a storage medium of the SSD 1200. For example, the nonvolatile memory device 1230 may be formed of a NAND flash memory device having a mass storage capacity. The nonvolatile memory device 1230 may be formed of a plurality of memory devices. In this case, memory devices may be connected with the SSD controller 1210 by a channel unit. The nonvolatile memory device 1230 is not limited to a NAND flash memory device. For example, a PRAM, an MRAM, a ReRAM, a FRAM, a NOR flash memory, etc. may be used as a storage medium of the SSD 1200. Further, the inventive concept may be applied to a memory system which uses different types of memory devices together. A volatile memory device (e.g., DRAM) can be used as the storage medium.

Figure 8:
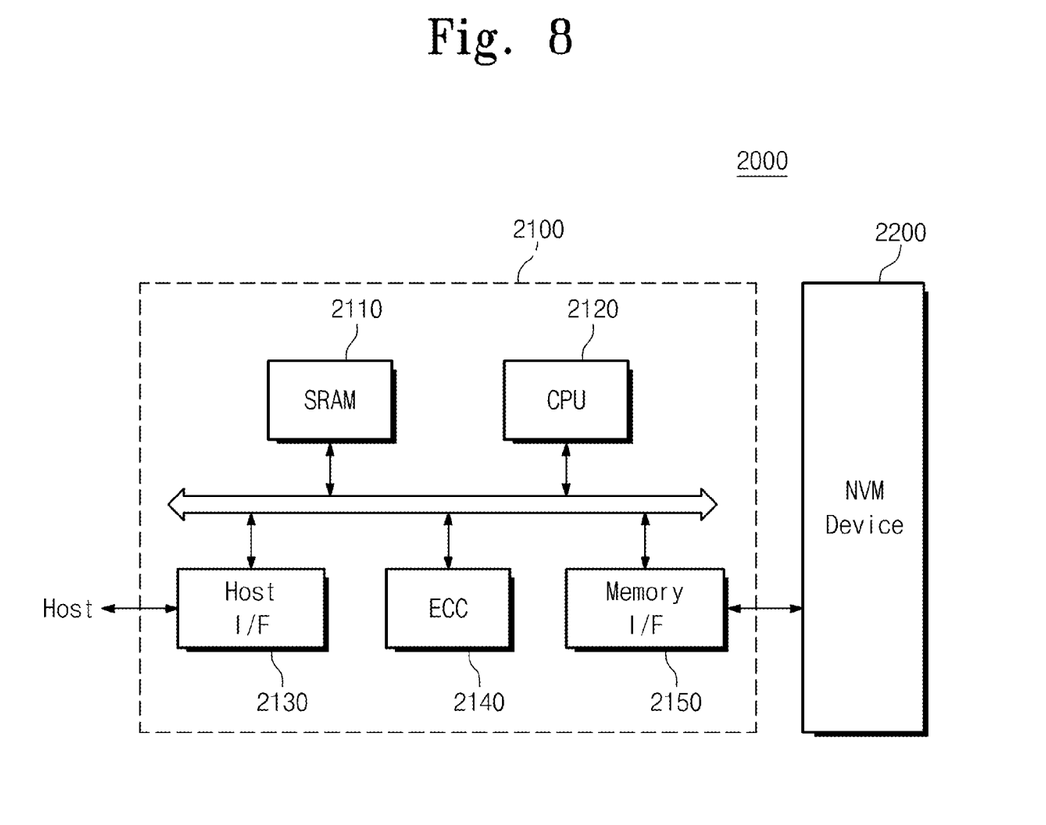
FIG. 8 is a block diagram illustrating a memory system according to an embodiment of the inventive concept.

FIG. 8 is a block diagram illustrating a memory system according to an embodiment of the inventive concept. Referring to FIG. 8, a data storage device 2000 may include a memory controller 2100 and a nonvolatile memory device 2200.

The memory controller 2100 may be configured to control the nonvolatile memory device 2200. The nonvolatile memory device 2200 and the memory controller 2100 may constitute a memory card. An SRAM 2110 may be used as a working memory. Herein, the SRAM 2110 may include a lookup table for storing an update number associated with each page of data. A host interface 2130 may include the data exchange protocol of a host connected with the data storage device 2000. An ECC circuit 2140 may be configured to detect and correct an error of data read out from the nonvolatile memory device 2200. A memory interface 2150 may be configured to interface with the nonvolatile memory device 2200 according to the inventive concept. As a processing unit, a CPU 2120 may be configured to perform an overall control operation for exchanging data. Although not shown, the data storage device 2000 may further include a ROM which stores code data for interfacing with a host.

The nonvolatile memory device 2200 may include a buffer region (not shown). The nonvolatile memory device 2200 may program the buffer region in a plurality of program modes according to a type of buffer data to be stored in the buffer region. In example embodiments, the program modes may include a high-speed program mode and a reliability program mode. At the high-speed mode, the nonvolatile memory device 2200 may program buffer data in a rapider speed as compared with the reliability mode. In example embodiments, the nonvolatile memory device 2200 may store buffer data in different regions that are divided according to program modes.

With this manner, a program speed on buffer data may increase, so that the program performance is improved.

The nonvolatile memory device 2200 may be implemented by a multi-chip package which is formed of a plurality of flash memory chips. The above-described memory system 2000 may be provided as a high-reliability storage medium with the low error probability. The memory controller 2100 may be configured to communicate with an external device (e.g., a host) via one of various interface protocols such as USB, MMC, PCI-E, SAS, SATA, PATA, SCSI, ESDI, IDE, etc.

Figure 9:
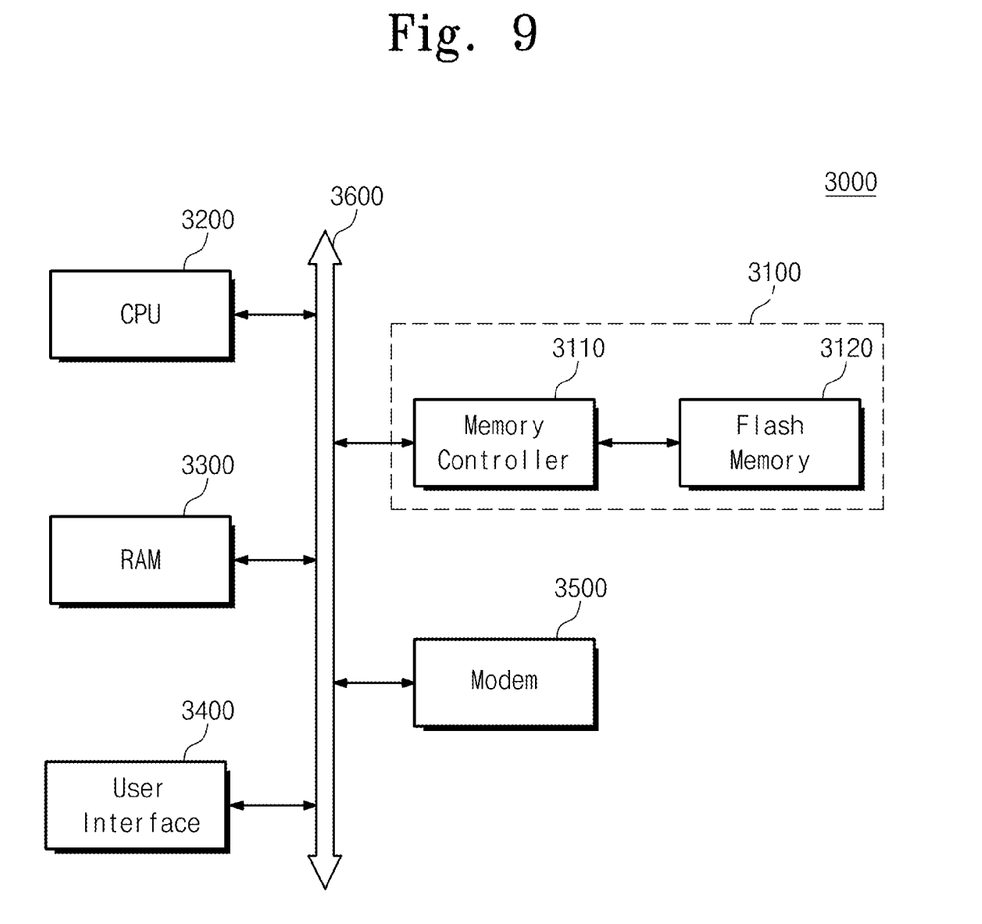
FIG. 9 is a block diagram illustrating a computational system including a flash memory device consistent with embodiments of the inventive concept.

FIG. 9 is a diagram schematically illustrating a computing system including a flash memory device. Referring to FIG. 9, a computing system 3000 may include a memory system 3100, a CPU 3200, a RAM 3300, a user interface 3400, and a modem 3500 such as a baseband chipset which are electrically connected with a bus 3600. The memory system 3100 may be configured to be substantially identical to an SSD in FIG. 7 or a memory system in FIG. 8.

In the event that the computing system 3000 is a mobile device, it may further comprise a battery (not shown) for powering the computing system 3000. Although not shown, the computing system 3000 may further include an application chipset, a camera image processor (CIS), a mobile DRAM, and the like. The memory system 3100 may constitute a solid state drive/drive (SSD) which uses a nonvolatile memory to store data, for example. Alternatively, the memory system 4100 may be implemented by a fusion memory (e.g., a One-NAND flash memory).

When a write request is issued from the CPU 3200, the nonvolatile memory device 3120 may program data. The nonvolatile memory device 3120 may include a buffer region (not shown). The nonvolatile memory device 3120 may program the buffer region in a plurality of program modes according to a type of buffer data to be stored in the buffer region. In example embodiments, the program modes may include a high-speed program mode and a reliability program mode. At the high-speed mode, the nonvolatile memory device 3120 may program buffer data in a rapider speed as compared with the reliability mode. In example embodiments, the nonvolatile memory device 3120 may store buffer data in different regions that are divided according to program modes.

With this manner, a program speed on buffer data may increase, so that the program performance is improved.

In example embodiments, a nonvolatile memory device and/or a memory controller may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the scope of the claims. Thus, to the maximum extent allowed by law, the scope is to be determined by the broadest permissible interpretation of the following claims and their equivalents, and shall not be restricted or limited by the foregoing detailed description.

What is claimed is:

1. A flash memory device array comprising:
    a memory cell array including a main region and a buffer region separately designated from the main region and configured to temporarily store buffer data to be programmed to the main region, wherein the buffer region is divided into a first buffer region and a second buffer region;

a page buffer configured to program buffer data to the buffer region; and control logic configured to control operation of the page buffer during the programming of the buffer data to the buffer region, wherein upon a determination by the control logic of a reliability mode the buffer data is stored in the first buffer region and upon a determination of a high-speed mode the buffer data is stored in the second buffer region, wherein the memory cell array is configured with M-bit, multi-level flash memory cells (MLCs), where M is an integer greater than 1, and the buffer data is programmed to the buffer region as 1-bit buffer data during the high-speed mode and the reliability mode, and wherein the buffer data is programmed during the high-speed mode and the reliability mode using an Incremental Step Pulse Programming (ISPP) pulse, such that an increment of the ISPP pulse during the high-speed mode is larger than an increment of the ISSP pulse during the reliability mode.

2. The flash memory device of claim 1, wherein a threshold voltage distribution for a MLC programmed during the high-speed mode is broader than a threshold voltage distribution for the MLC programmed during the reliability mode.

3. The flash memory device of claim 1, wherein a program voltage used to program the buffer data during the high-speed mode is higher than that a program voltage used to program the buffer data during the reliability mode.

4. The flash memory device of claim 1, wherein a program verification voltage used during the high-speed mode is higher than that a program verification voltage used during the reliability mode.

5. The flash memory device of claim 1, wherein a read voltage used during the high-speed mode is lower than that a read voltage used during the reliability mode.

6. A memory system comprising:

a memory controller including a Synchronous Read Only Memory (SRAM) providing 1-bit buffer data; and a flash memory device array receiving the 1-bit buffer data and comprising:

a memory cell array including a main region and a buffer region separately designated from the main region and configured to temporarily store buffer data to be programmed to the main region, wherein the buffer region is divided into a first buffer region and a second buffer region;

a page buffer configured to program buffer data to the buffer region; and control logic configured to control operation of the page buffer during the programming of the buffer data to the buffer region, wherein upon a determination by the control logic of a reliability mode the buffer data is stored in the first buffer region and upon a determination of a high-speed mode the buffer data is stored in the second buffer region, wherein the memory cell array is configured with M-bit, multi-level flash memory cells (MLCs), where M is an integer greater than 1, and the buffer data is programmed to the buffer region as 1-bit buffer data during the high-speed mode and the reliability mode, and wherein the buffer data is programmed during the high-speed mode and the reliability mode using an Incremental Step Pulse Programming (ISPP) pulse, such that an increment of the ISPP pulse during the high-speed mode is larger than an increment of the ISSP pulse during the reliability mode.

7. The memory system of claim 6, wherein a threshold voltage distribution for a MLC programmed during the high-speed mode is broader than a threshold voltage distribution for the MLC programmed during the reliability mode.

8. The memory system of claim 6, wherein a program voltage used to program the buffer data during the high-speed mode is higher than that a program voltage used to program the buffer data during the reliability mode.

9. The memory system of claim 6, wherein a program verification voltage used during the high-speed mode is higher than that a program verification voltage used during the reliability mode.

10. The memory system of claim 6, wherein a read voltage used during the high-speed mode is lower than that a read voltage used during the reliability mode.

11. A method of programming a memory cell array including a main region and a separately designated buffer region divided into a first buffer region and a second buffer region, the method comprising:

receiving buffer data and determining between a high-speed mode and a reliability mode for buffer data; and upon determining the reliability mode storing the buffer data in the first buffer region, and upon determining the high-speed mode storing the buffer data in the second buffer region, wherein the buffer data is stored during the reliability mode and the high-speed mode using an Incremental Step Pulse Programming (ISSP) pulse, and an increment for the ISSP pulse during the high-speed mode is greater than an increment for the ISSP pulse during the reliability mode.

12. The method of claim 11, wherein a level for a program voltage used during the high-speed mode is greater than a level for the program voltage during the reliability mode.

13. The method of claim 11, wherein a level for a program verification voltage used during the high-speed mode is less than a level for the program verification voltage during the reliability mode.

14. The method of claim 11, wherein a level for a read voltage used during the high-speed mode is less than a level for the read voltage during the reliability mode.

15. The method of claim 11, wherein the memory cell array is configured with M-bit, multi-level flash memory cells (MLCs), where M is an integer greater than 1, and the buffer data is programmed to the buffer region as 1-bit buffer data during the high-speed mode and the reliability mode.

* * * * *